United States Patent [19]
Mohler

[11] Patent Number: 5,506,872
[45] Date of Patent: Apr. 9, 1996

[54] DYNAMIC COMPRESSION-RATE SELECTION ARRANGEMENT

[75] Inventor: David S. Mohler, Westminster, Colo.

[73] Assignee: AT&T Corp., Murray Hill, N.J.

[21] Appl. No.: 233,495

[22] Filed: Apr. 26, 1994

[51] Int. Cl.⁶ .................................................. H04B 1/66
[52] U.S. Cl. ............................ 375/240; 379/88; 379/67; 364/241.7; 364/245.1
[58] Field of Search ............................ 375/122; 379/88, 379/89, 90, 67; 364/241.7, 245, 245.1

[56] References Cited

U.S. PATENT DOCUMENTS

| | | | |
|---|---|---|---|
| 4,652,700 | 3/1987 | Matthews et al. | 379/89 |
| 4,730,348 | 3/1988 | MacCrisken | 375/122 |
| 4,791,660 | 12/1988 | Oye et al. | 379/88 |
| 4,837,798 | 6/1989 | Cohen et al. | 379/88 |
| 5,133,004 | 7/1992 | Heileman, Jr. et al. | 379/67 |
| 5,276,898 | 1/1994 | Kiel et al. | 395/800 |

FOREIGN PATENT DOCUMENTS

| | | |
|---|---|---|
| 62-056038 | 3/1987 | Japan. |
| 2162954 | 6/1990 | Japan. |
| 5292194 | 11/1993 | Japan. |

*Primary Examiner*—Stephen Chin
*Assistant Examiner*—Bryan E. Webster
*Attorney, Agent, or Firm*—D. Volejnicek; J. J. Trainor

[57] ABSTRACT

A signal compression-selection arrangement (19) dynamically trades off signal storage capacity against signal quality, by sacrificing capacity in favor of signal quality whenever capacity is plentiful and sacrificing quality in favor of capacity whenever capacity is scarce. In a messaging system (FIG. 1), the arrangement monitors the amount of storage (14, 15) that is presently free and available for storing new messages, either on a system-wide or per-mailbox basis, and automatically selects a higher compression rate (13) than a presently-applied compression rate (13) to be applied to newly-received messages as the amount of free storage falls below each predetermined threshold. Storage capacity may be freed up by re-compressing (FIG. 3) at the new, higher, compression rate those stored messages that were previously compressed at a lower compression rate.

21 Claims, 2 Drawing Sheets

DYNAMIC COMPRESSION-RATE SELECTION ARRANGEMENT

TECHNICAL FIELD

This invention relates to compression of information-carrying signals, such as voice, video, data, and other telecommunications signals.

BACKGROUND OF THE INVENTION

It is well known in the art that many types of signals that are used to convey information carry superfluous or redundant information, and that the signals or portions of signals that convey the superfluous or redundant information may be discarded to increase the density or reduce the number of information-carrying signals without loss of desirable information. It is also known that the density or number of signals may often be respectively increased or reduced further, thereby sacrificing only some quality of the desirable information without loss of the basic desired information content. Techniques for achieving these increases in the density or reductions in the number of signals are commonly called compression techniques, and many are known in the art.

It is also known in the art to equip a signal-processing system with the ability to perform a plurality of compression techniques and leave it up to a user of the system, or to the system itself, to select which one of these techniques is actually used, as disclosed, for example, in U.S. Pat. No. 4,791,660. The selection may be done statically, such as by administratively specifying which compression technique will be used for all signal processing, prior to activation of the processing system. Or, the selection may be done dynamically, such as by every application program specifying to the system the compression technique that it desires to use for processing relating to that application program, as taught by U.S. Pat. No. 5,133,004, or by constantly monitoring the efficiency of compression being performed and automatically changing the compression technique being used in order to constantly adapt the system to changing characteristics of the signals being processed, as taught by U.S. Pat. No. 4,730,348.

All known signal-processing systems have finite signal transmission throughput and/or signal storage capacity. Since the selection of the compression technique affects the density or the number of signals that must be stored or transmitted to represent a given amount of information, the selection of the compression technique directly affects the information throughput or information storage capacity of a processing system. However, as was also alluded to previously, the selection of the compression technique also affects the quality of the conveyed or stored information. Hence, the selection of the compression technique normally involves a tradeoff between throughput and/or storage capacity on the one hand, and signal quality on the other hand.

SUMMARY OF THE INVENTION

Generally according to the invention, a technical advance is achieved in the art by a compression-selection apparatus and method that dynamically trades off capacity against signal quality, by sacrificing capacity in favor of signal quality whenever capacity is plentiful and sacrificing quality in favor of capacity whenever capacity is scarce. For example, in a voice-messaging system, the arrangement monitors the amount of storage that is presently free and available for storing new voice messages, either on a system-wide or per-mailbox basis, and automatically selects a new compression technique having a higher compression rate than a presently-used-technique to be applied to newly-received messages as the amount of free storage falls below each predetermined threshold.

According to the invention as claimed, an apparatus comprises a compressing arrangement responsive to incoming signals for compressing the received signals at any of a plurality of different compression rates in order to produce compressed signals, a storage arrangement having a finite storage capacity for storing the compressed signals, and a control arrangement for automatically causing the compressing arrangement to change the rate of compressing the received signals in response to changes in the storage arrangement's storage capacity that is presently free of stored compressed signals. The control arrangement causes the compressing arrangement to vary the compression rate inversely with variations in the free storage capacity. That is, it causes the compression rate to be increased in response to decreased free storage capacity. A dynamic quality vs. capacity trade-off is thus implemented.

Preferably, the storage capacity of the storing arrangement is divided into a plurality of levels, and the control arrangement causes the compressing arrangement to change the compression rate every time that the free storage capacity changes from one level to another. Also preferably, the storage arrangement is partitioned into a plurality of partitions, such as message mailboxes, and the control arrangement automatically causes the compressing arrangement to individually change the compression rate of compressing received signals —e.g., messages— that are destined for storage in any individual partition in response to change in the free storage capacity of that individual partition.

Further according to the invention as claimed, a method of compressing signals comprises the steps of receiving signals, compressing the received signals at a compression rate to produce compressed signals, storing the compressed signals in a store having finite storage capacity, determining a change in the store's storage capacity that is presently free of stored compressed signals and, in response to the determination, automatically changing the compression rate that is being used to compress the received signals.

The invention provides great cost and performance advantages for limited-capacity systems, such as messaging systems, for example. It allows the systems to be equipped with less storage capacity, and to normally provide a higher-quality service (i.e., to normally use a lower compression rate) than would otherwise be possible without increasing the likelihood of capacity overruns and the consequent loss of received signals (i.e., messages). As free capacity becomes exhausted, instead of received signals being lost for lack of capacity, merely some of the signal quality is sacrificed to effectively stretch the remaining free capacity, by compressing newly-received signals at a higher compression rate. Furthermore, as free capacity becomes exhausted, additional free capacity may actually be created at the price of some sacrifice in signal quality, by re-compressing previously-compressed and stored signals at a higher compression rate. Significantly, the sacrifice in signal quality is made only in extreme circumstances, when necessary to prevent signal loss, but is not made during normal operation, when capacity is plentiful. Moreover, these adjustments are made by the system automatically and dynamically, without need for human monitoring, supervision, or intervention.

These and other advantages and features of the present invention will become more apparent from the following description of an illustrative embodiment of the invention taken together with the drawing.

DETAILED DESCRIPTION

Figure 1:
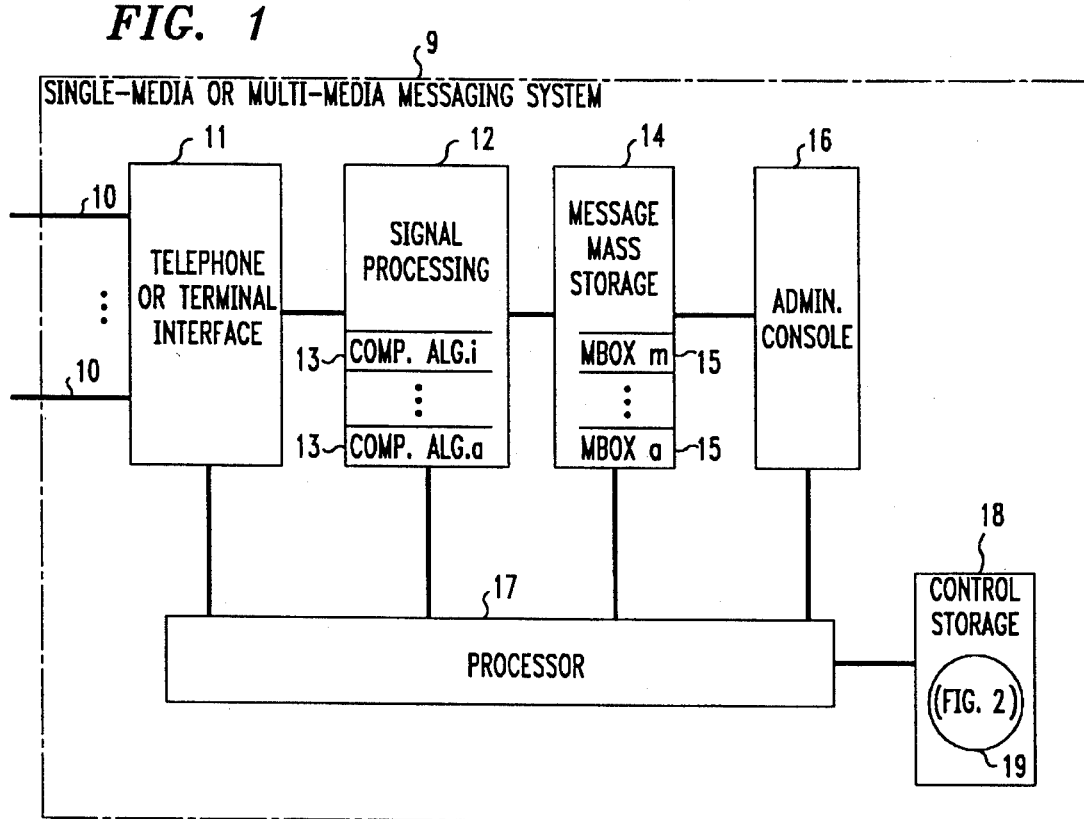
FIG. 1 is a block diagram of a single-media or multi-media messaging system that includes an illustrative embodiment of the invention.

FIG. 1 shows a block diagram of a single-media or multi-media messaging system 9, such as an AT&T Intuity™ messaging system. System 9 is substantially conventional in its configuration. It includes a telephony or a terminal interface 11 which couples system 9 to a plurality of communication links 10 and performs control-signal monitoring and generation with respect to those links 10. Links 10 may comprise, for example, telephony lines or trunks, local area networks, or any other suitable connectivity arrangements. User-information carrying signals, that is, single-media or multi-media messages, being conveyed by links 10 to or from system 9 are sent or received, respectively, by telephone interface 11 to or from signal processing 12. Signal processing 12 conventionally comprises a programmable digital signal processor (DSP), such as the AT&T DSP 32000, that performs any requisite analog-to-digital and/or digital-to-analog conversion of the messages and that is programmed with a plurality of known digital-signal compression algorithms 13. Examples of suitable compression algorithms 13 include, but are not limited to, 64 kbps pulse-code modulation (PCM), 32 kbps adaptive pulse-code modulation (ADPCM), and 16 kbps ADPCM. Signal processing 12 in turn sends or receives compressed messages to or from message mass storage 14, where those messages are stored in individual subscriber's mailboxes 15. Message mass storage 14 is, for example, a hard disk.

System 9 is a stored-program-controlled system that operates under control of a processor 17 executing control programs that are stored in control storage 18 such as read-only memory (ROM) and random-access memory (RAM). Additionally, manual control over system 9 may be exerted by a system administrator by means of an administrative console 16.

Control programs stored in control storage 18, with the exception of program 19, are conventional. They include a user mapping program that partitions message mass storage 14 into mailboxes 15, and a system task manager that effects the proper timing and sequencing of execution of the various control application programs that are included in system 9. According to the invention, there is also included in control storage 18 a dynamic compression-rate selection program 19 which causes signal processing 12 to execute different compression algorithms 13 depending upon the free storage capacity of either individual mailboxes 15 or message mass storage 14 as a whole. The functionality of program 19 is flowcharted in FIG. 2.

Figure 2:
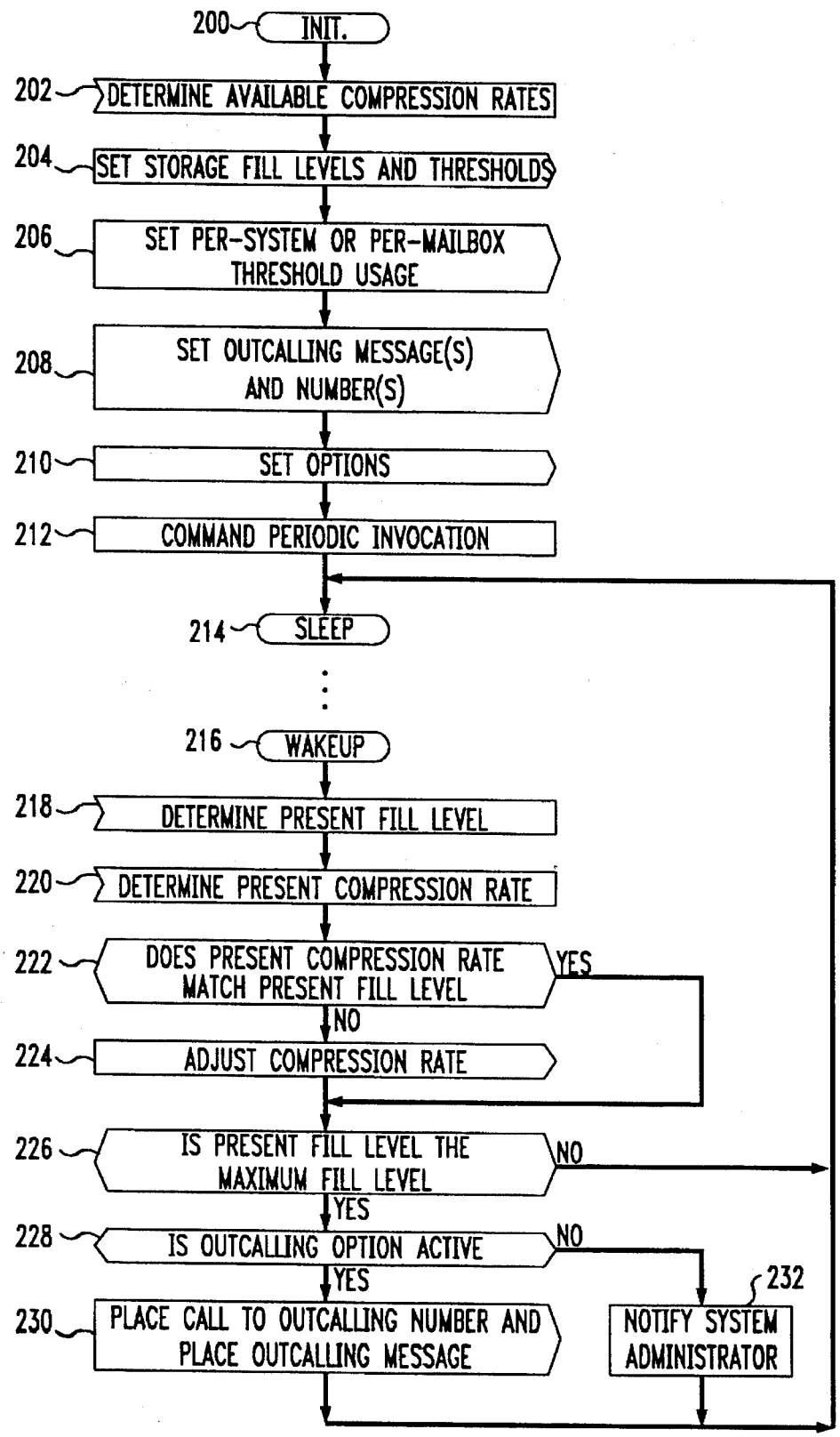
FIG. 2 is a flow diagram of basic functionality of the dynamic compression-rate selection program of the system of FIG. 1.

Program 19 commences to execute at initialization of system 9, at step 200 of FIG. 2. Program 19 interrogates signal processing 12 to determine what compression rates are made available by compression algorithms 13, at step 202. Based upon how many different compression rates are determined to be available, program 19 internally automatically sets that many storage fill levels and storage fill level thresholds, at step 204. For example, if compression rates of 64kbps, 32kbps, and 16kbps are available, program 19 sets three fill levels with exemplary thresholds of 50% full and 75% full separating the levels: below 50% full, the 64kbps low compression rate will be used, between 50% and 75% full, the 32kbps higher compression rate will be used, and above 75% full, the 16kbps highest compression rate will be used. Alternatively, program 19 determines the number of fill levels, fill level thresholds, and the compression rate to be used for each fill level, either through interaction via console 16 with the administrator of system 9 or through interaction via telephony interface 11 and communication links 10 with individual users of the system, with program 19 making sure that the number of fill levels does not exceed the number of different compression rates available from signal processing 12 and that signal processing can provide each of the compression rates specified by the administrator or the user.

Following step 204, program 19 determines whether the fill levels and thresholds set at step 204 will be applied either separately to each individual mailbox 15 or to message mass storage 14 as a whole, at step 206. This determination is again made either automatically or through interaction with the system administrator. Program 19 then internally sets an out-calling message and telephone number, either for the system as a whole or for each individual mailbox's subscriber, depending upon the determination made at step 208. System 9 will dial this number and play this message when mass storage 14 or a corresponding mailbox 15 reaches the highest fill level. The message will notify the administrator or subscriber of impending system message storage or mailbox message storage overflow. Normally, a system-wide message and number, and a default message and number for each mailbox 15, will be provided administratively via console 16. When fill levels and thresholds are being applied to each individual mailbox 15 at step 206, each subscriber will also have the option of individually specifying a message and a number for the subscriber's own mailbox 15, through a conventional type of interaction with that mailbox 15. The targets for these out-calling messages could be a plurality of messaging systems; for example, fax, voice, electronic mail, paging, etc.

Following step 208, program 19 determines and sets various dynamic compression-rate selection options that may be provided, at step 210. Such options may include, for example, whether out-calling is activated and whether the rate selection is to be applied to all media components or only to selected media components (e.g., only to voice) of multi-media messages. Typically, the option settings will be specified administratively. At this point, the initialization activities of program 19 are completed, and program 19 commands the system's task manager to periodically invoke program 19 during the operation of system 9, at step 212, and temporarily ends its execution ("goes to sleep"), at step 214.

Upon being invoked ("awakened"), at step 216, program 19 determines from message mass storage 14 the present fill level either of message mass storage 14 as a whole or of each individual mailbox 15, depending upon what threshold usage was set at step 206, at step 218. For each fill level determined at step 216, program 19 interrogates signal processing 12 to determine the compression rate that is presently being applied with respect to the corresponding storage (mass storage 14 or mailbox 15), at step 220. Program 19 then checks the settings that were made at step 204 to determine whether the present compression rate corresponds to the present fill level for that storage, at step 222. If not, program 19 commands signal processing 12 to change the compression rate being applied with respect to the corresponding storage to either a higher or a lower rate for the media specified at step 210 so as to match the present fill level, at step 224.

Signal processing 12 changes the compression rate in the requested manner. With respect to each incoming message that it compresses for storage in message mass storage system 14, signal processing 12 includes an indication of which compression algorithm 13 was used to compress the message. In that way, signal processing 12 knows which decompression algorithm to apply to the message when it is retrieved from message mass storage 14 for play-back.

Following step 224, program 19 checks whether the present fill level for the subject storage (message mass storage 14 or mailbox 15) is the maximum fill level, at step 226. If not, program 19 returns to sleep, at step 214; if so, program 19 checks the settings that were made at step 210 to determine if the out-calling option is active, at step 228. If out-calling is active, program 19 retrieves the information that was stored at step 208, places a call to the specified out-calling number, and when the call is answered plays the specified out-calling message, at step 230, to notify the answering party of impending storage overflow. If out-calling is not active, program 19 merely notifies the administrator of system 9 of the impending storage overflow via console 16, at step 232. Following step 230 or 232, program 19 returns to sleep, at step 214.

It should now be evident that, as a consequence of the functions performed by program 19, message storage capacity is conserved at the expense of message signal quality when message storage capacity begins to run short, as a consequence of applying compression algorithms of progressively-higher compression rate as storage capacity is used up, and that message storage capacity is sacrificed in favor of message signal quality when message storage capacity is plentiful, as a consequence of applying compression algorithms of progressively-lower compression rate as storage capacity is freed up.

Figure 3:
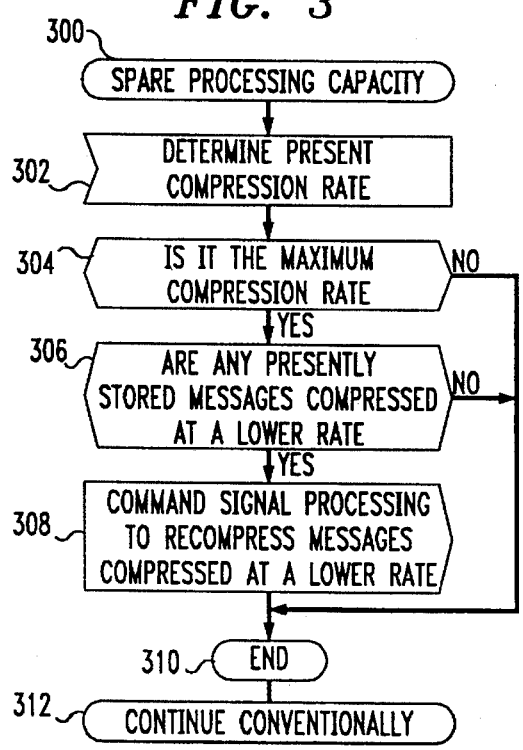
FIG. 3 is a flow diagram of optional functionality of the dynamic compression-rate selection program of the system of FIG. 1.

An optional extension to the functionality of FIG. 19 takes an even more radical step in conserving diminishing free storage capacity, by re-compressing already compressed and stored messages at a higher compression rate when free capacity begins to run out. This optional extension is flow-charted in FIG. 3.

When spare processing capacity is available in system 9, such as when few or no messages are being received or played out by system 9, execution of the optional extension of program 19 is invoked, at step 300. In response, program 19 determines from signal processing 12 the present compression rate that is being applied either to message mass storage 14 as a whole or to each individual mailbox 15, depending upon what threshold usage was set at step 206, at step 302. Program 19 then checks whether a compression rate determined at step 302 is the maximum compression rate, at step 304. If not, program 19 merely ends its execution, at step 310; if so, program 119 checks message mass storage 14 for whether there are any stored messages in the corresponding storage (message mass storage 14 or mailbox 15) that are compressed at a lower rate, at step 306. If no messages in the corresponding storage are compressed at a lower rate, program 19 proceeds to step 310 to end its execution. If any messages in the corresponding storage are compressed at a lower rate, program 19 commands signal processing 12 to retrieve these messages, re-compress them at the highest compression rate, and re-store them in message mass storage 14, at step 308, thereby freeing more storage capacity in message mass storage 14. Program 19 then proceeds to step 310 to end its execution, whereupon conventional processing resumes, at step 312.

Of course, various changes and modifications to the illustrative embodiment described above will be apparent to those skilled in the art. For example, a single version of the compression-rate selection program may work on only a single medium, while multiple invocations or versions of the program work on different media (e.g., voice, fax, e-mail, video, etc.) with each invocation or version being optimized for its corresponding medium. Or, a single invocation of the program may work on multiple media and divide its processing time between the various media in either a static or a dynamic manner. Also, the invention may be employed on a variety of platforms, such as in distributed systems that employ multiple storage media, multiple signal processors, and/or multiple control mechanisms. In distributed systems, either one invocation of the compression-rate selection program may be linked to all of the system portions to control the entire system, or individual invocations of the program in the various portions may be networked and synchronized to cooperate with each other in controlling the system. Furthermore, logs may be kept that show the percent of time that the system spends at individual ones of the fill thresholds, and this information may be used to determine, and report to system users, when more bulk storage is needed to be added to a growing system. Further yet, out-calling may be cascaded, so that a whole sequence of numbers is contacted in series until a call actually gets through. Such changes and modifications can be made without departing from the spirit and the scope of the invention and without diminishing its attendant advantages. It is therefore intended that such changes and modifications be covered by the following claims.

I claim:

1. An apparatus comprising:

means responsive to incoming signals, for compressing the incoming signals at any of a plurality of different compression rates, to produce compressed signals;

means having a finite storage capacity, for storing the compressed signals;

means for automatically causing the compressing means to increase the rate of compressing the incoming signals, in response to decrease in the storage means' storage capacity that is presently free of stored compressed signals.

2. The apparatus of claim 1 wherein the causing means automatically cause the compressing means to vary the compression rate inversely with variations in the free storage capacity.

3. The apparatus of claim 1 wherein the storage capacity of the storing means is divided into a plurality of levels; and the causing means cause the compressing means to change the compression rate every time that the free storage capacity changes from one level to another.

4. The apparatus of claim 1 wherein the storage means is partitioned into a plurality of partitions; and the causing means automatically cause the compressing means to individually change the compression rate of compressing received signals that are destined for storage in any individual partition in response to change in the free storage capacity of that individual partition.

5. The apparatus of claim 1 wherein the storage means is partitioned into a plurality of message mailboxes; the received signals comprise a plurality of messages each destined for a mailbox; and the causing means automatically cause the compressing means to individually vary the compression rate of compressing received messages that are destined for any individual mailbox inversely with variations in the free storage capacity of that individual mailbox.

6. The apparatus of claim 1 wherein the received signals comprise multi-media messages each comprising message segments of a plurality of different media; and the causing means cause the compressing means to differently change the compression rate for message segments of different ones of the media.

7. The apparatus of claim 1 further comprising means responsive to the free storage capacity falling below a predetermined threshold, for generating an alert.

8. The apparatus of claim 7 wherein the means for generating an alert comprise means for placing a call to a predetermined address; and means responsive to the call being answered, for sending a predetermined message via the call.

9. The apparatus of claim 5 further comprising the means responsive to the free storage capacity of an individual mailbox falling below a predetermined threshold, for calling an owner of the individual mailbox; and means for sending a predetermined message to the called owner to alert the called owner.

10. The apparatus of claim 1 further comprising means responsive to the compressing means increasing the compression rate, for causing the compressing means to re-compress at the increased compression rate any signals stored in the storing means that are compressed at a lower compression rate.

11. A messaging system comprising:

a memory defining a plurality of mailboxes each for storing compressed messages destined for that mailbox, each mailbox having a finite storage capacity;

a signal processor responsive to receiving messages, for compressing the received messages at any of a plurality of different compression rates to produce the compressed messages; and means for automatically causing the signal processor to increase the compression rate of compressing the received messages that are destined for any individual mailbox, in response to detecting a predetermined decrease in the individual mailbox's storage capacity that is presently free of stored compressed messages.

12. The messaging system of claim 11 wherein:

the causing means include means for automatically causing the signal processor to decrease the compression rate of compressing the received messages that are destined for said any individual mailbox, in response to detecting a predetermined increase in the free storage capacity of that individual mailbox.

13. The messaging system of claim 12 wherein the storage capacity of each mailbox is divided into a plurality of levels; and the causing means cause the signal processor to change the compression rate of compressing the received messages that are destined for any individual mailbox every time that the free storage capacity of that individual mailbox changes from one level to another.

14. The messaging system of claim 13 wherein the received messages include multi-media messages each comprising message segments of a plurality of different media; and the causing means cause the signal processor to differently change the compression rate for message segments of different ones of the media.

15. The messaging system of claim 13 further comprising means responsive to the free storage capacity of an individual mailbox falling below a a predetermined threshold, for calling an owner of the individual mailbox; and means for sending a predetermined message to the called owner to alert the called owner.

16. The messaging system of claim 13 further comprising:

means responsive to the signal processor increasing the compression rate of compressing the received messages that are destined for an individual mailbox to a predetermined rate, for causing the signal processor to re-compress at the predetermined rate any messages stored in the individual mailbox that are compressed at a compression rate lower than the predetermined rate.

17. A method of compressing signals comprising the steps of:

receiving signals;

compressing the received signals at a compression rate to produce compressed signals;

storing the compressed signals in a store having finite storage capacity;

determining a decrease in the store's storage capacity that is presently free of stored compressed signals; and in response to the determining, automatically increasing the compression rate that is being used to compress the received signals.

18. The method of claim 17 wherein the step of storing comprises the step of storing the compressed signals in a store having a finite storage capacity that is divided into a plurality of levels;

the step of determining comprises the step of determining that the free storage capacity of the store has changed from one level to another;

and the step of automatically changing comprises the step of automatically changing the compression rate that is being used to compress the received signals inversely with the level change in the free storage capacity.

19. The method of claim 17 wherein the step of receiving signals comprises the step of receiving messages each destined for a mailbox;

the step of compressing comprises the step of compressing any received message destined for an individual mailbox at a compression rate presently corresponding to the individual mailbox, to produce a compressed message;

the step of storing comprises the step of storing the compressed message in the individual mailbox defined along with other mailboxes in the store and having a finite storage capacity;

the step of determining comprises the step of determining a change in the individual mailbox's storage capacity that is presently free of stored compressed messages; and the step of changing comprises the step of automatically changing the compression rate that is being used to compress received messages destined for the individual mailbox inversely with the change in the free storage capacity of that individual mailbox.

20. The apparatus of claim 1 wherein:

the causing means further automatically cause the compressing means to decrease the compression rate in response to increase in the free storage capacity.

21. The method of claim 17 further comprising the steps of:

determining an increase in the free storage capacity;

in response to the determining of the increase, automatically decreasing the compression rate that is being used to compress the received signals.

* * * * *